United States Patent
Cho et al.

(10) Patent No.: US 7,507,434 B2
(45) Date of Patent: Mar. 24, 2009

(54) METHOD AND APPARATUS FOR LAMINATING A FLEXIBLE PRINTED CIRCUIT BOARD

(75) Inventors: Jeong Cho, Yongin-Shi (KR); Young Kwan Lee, Seoul (KR); Young Seop Kim, Seoul (KR)

(73) Assignee: Toray Saehan Inc., Gumi (KR)

( * ) Notice: Subject to any disclaimer, the term of this patent is extended or adjusted under 35 U.S.C. 154(b) by 611 days.

(21) Appl. No.: 11/194,500

(22) Filed: Aug. 1, 2005

(65) Prior Publication Data

US 2006/0024449 A1   Feb. 2, 2006

(30) Foreign Application Priority Data

Aug. 2, 2004   (KR) .................. 10-2004-0060894

(51) Int. Cl.
*B05D 5/12*   (2006.01)
(52) U.S. Cl. .................. 427/96.1; 427/96.8; 427/97.1; 427/97.6; 427/98.6; 427/532
(58) Field of Classification Search ........... 427/96.1, 427/96.8, 97.1, 97.6, 98.6, 532, 585
See application file for complete search history.

(56) References Cited

U.S. PATENT DOCUMENTS

| | | | | |
|---|---|---|---|---|
| 4,376,154 A | * | 3/1983 | Nakatsugawa | ............... 428/607 |
| RE31,474 E | * | 12/1983 | Brook et al. | ................. 148/563 |
| 5,484,517 A | * | 1/1996 | Hopson, Jr. | ................... 205/88 |
| 6,171,714 B1 | * | 1/2001 | Bergkessel et al. | .......... 428/618 |
| 6,284,329 B1 | * | 9/2001 | Matienzo et al. | ............ 427/537 |
| 6,486,413 B1 | * | 11/2002 | Ogure | ........................ 174/261 |
| 6,651,871 B2 | * | 11/2003 | Ogure | ..................... 228/248.1 |
| 7,267,883 B2 | * | 9/2007 | Fujihara et al. | .......... 428/473.5 |
| 7,281,328 B2 | * | 10/2007 | Lee et al. | ....................... 29/852 |
| 7,282,255 B2 | * | 10/2007 | Hiranaka et al. | ............. 428/209 |
| 2006/0101640 A1 | * | 5/2006 | Lee et al. | ........................ 29/846 |
| 2006/0125893 A1 | * | 6/2006 | Lee et al. | ........................ 347/87 |
| 2007/0065683 A1 | * | 3/2007 | Sonoda et al. | ............ 428/833.2 |
| 2007/0158020 A1 | * | 7/2007 | Tu et al. | ................... 156/272.6 |
| 2007/0269588 A1 | * | 11/2007 | Lee et al. | .................... 427/97.2 |

FOREIGN PATENT DOCUMENTS

GB   2086426 A   *   5/1982

OTHER PUBLICATIONS

Yousef, Hanna et al., Plated through-hole vias in a porous polyimide foil for flexible printed circuit boards. J. Micromech. Microeng. 18 (2008) pp. 1-6.*

* cited by examiner

*Primary Examiner*—Bret Chen

(57) ABSTRACT

An approach is provided for laminating layers for a flexible printed circuit board. The approach includes a method and apparatus for providing a base substrate and the surface of the base substrate is treated by radiating ion beams using a gas mixture including oxygen and argon to improve adhesive strength and heat resistance. A tie layer can be formed on the based film to prevent a metal conductive layer from diffusion and to increase the adhesive strength.

8 Claims, 8 Drawing Sheets

[Fig. 1]
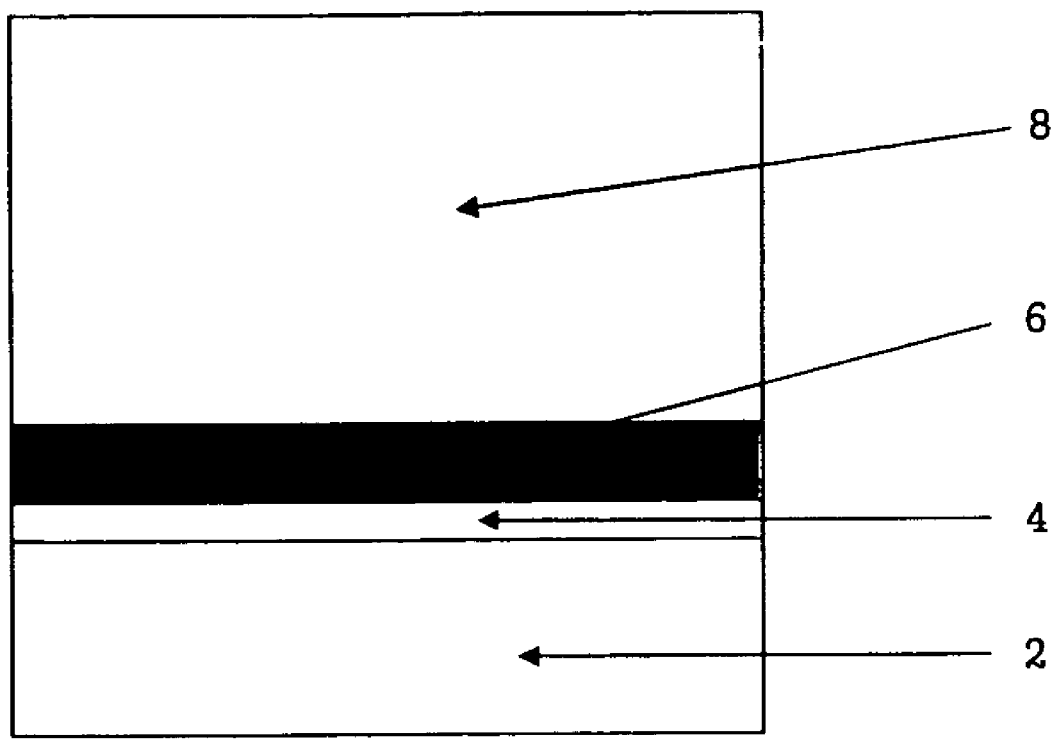

[Fig. 2]
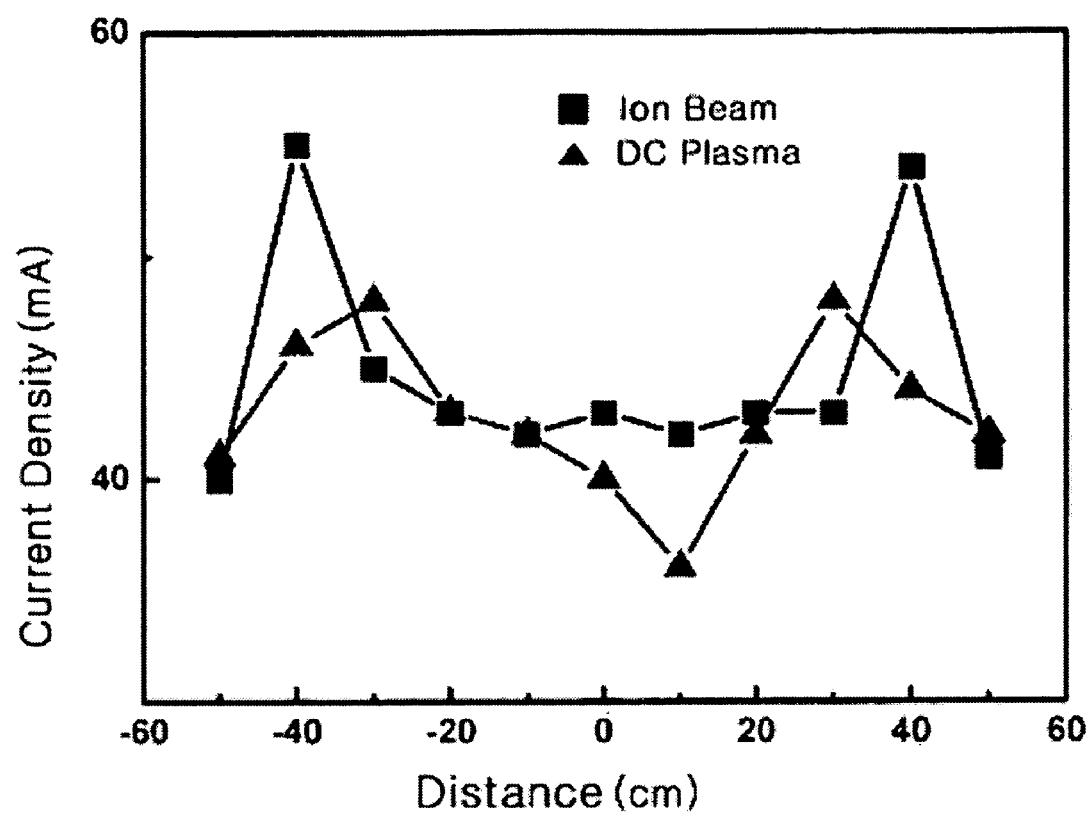

[Fig. 3]
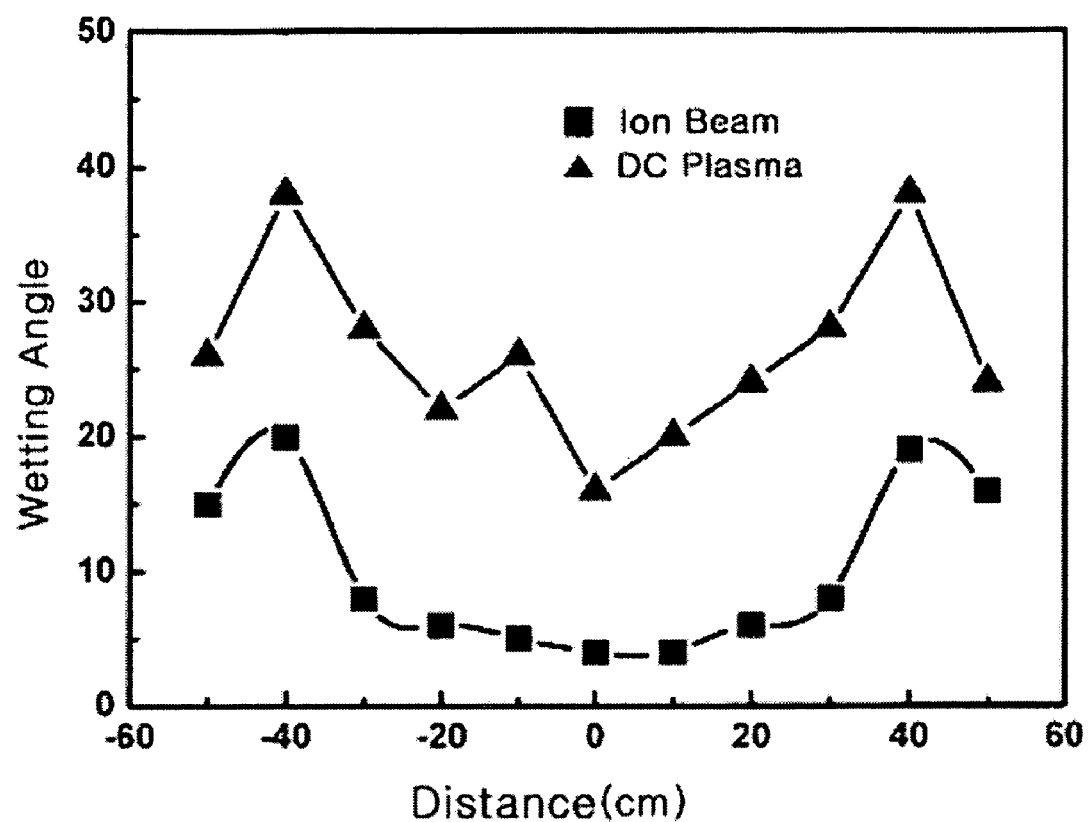

[Fig. 4]
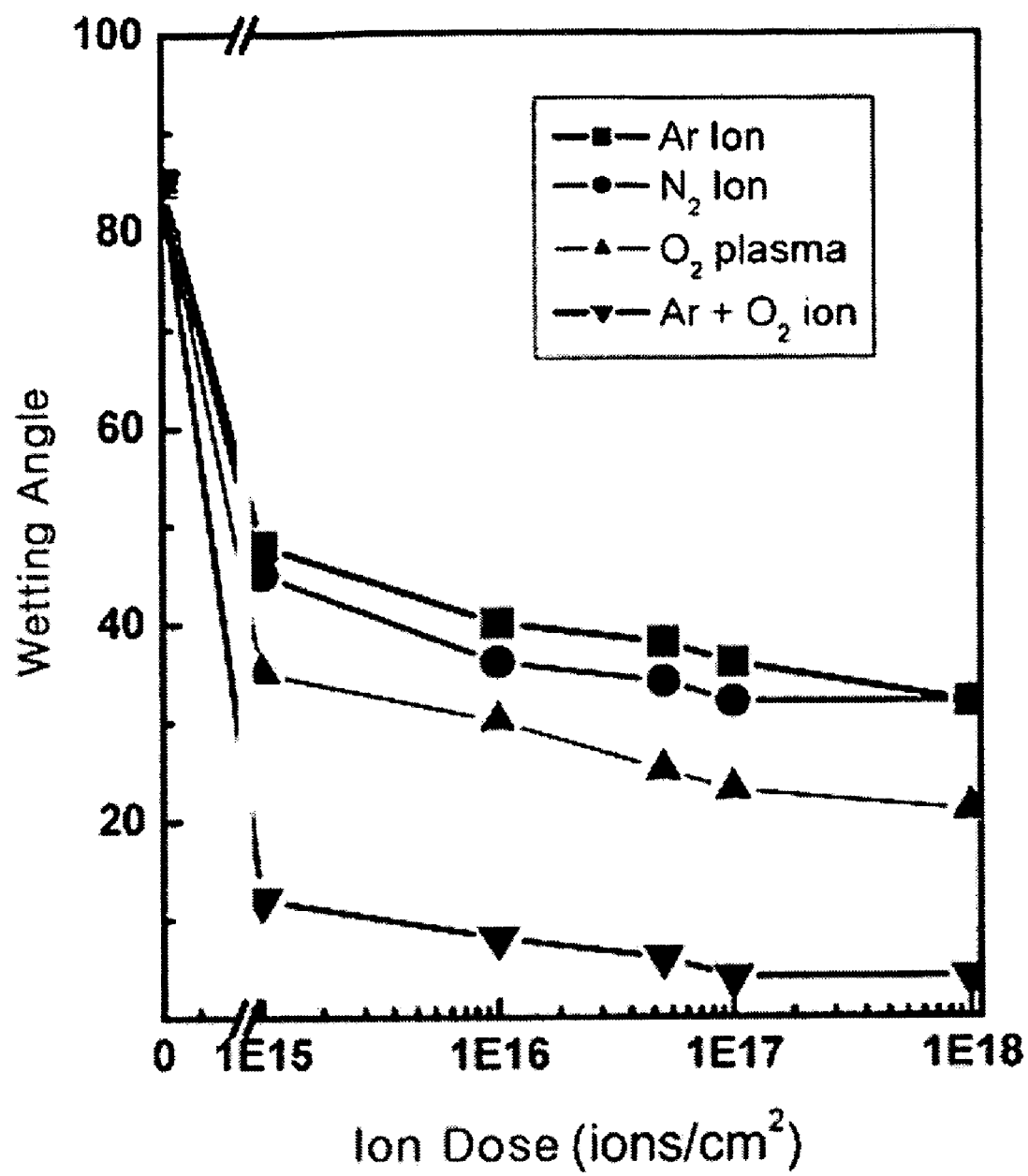

[Fig. 5]
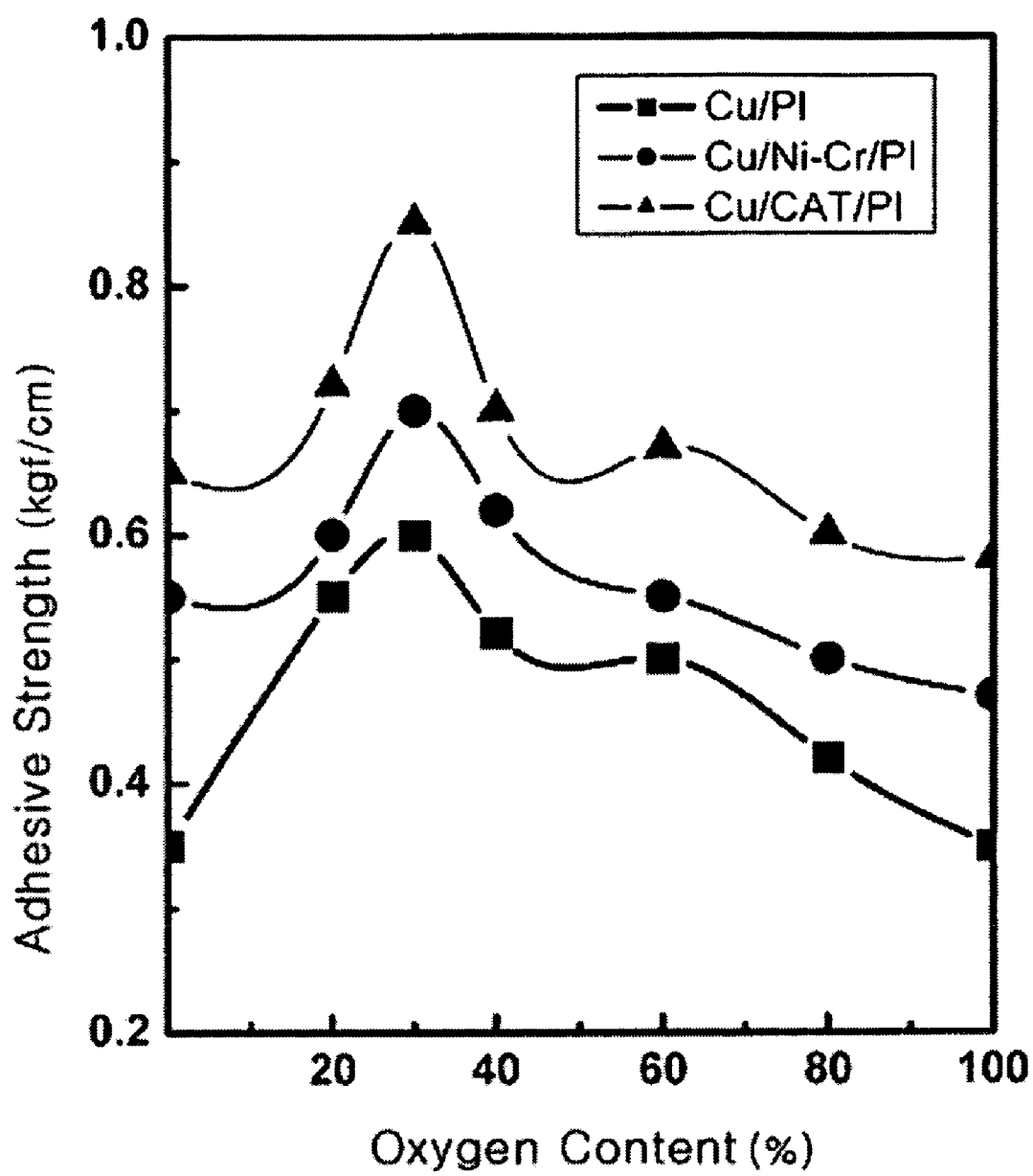

[Fig. 6]
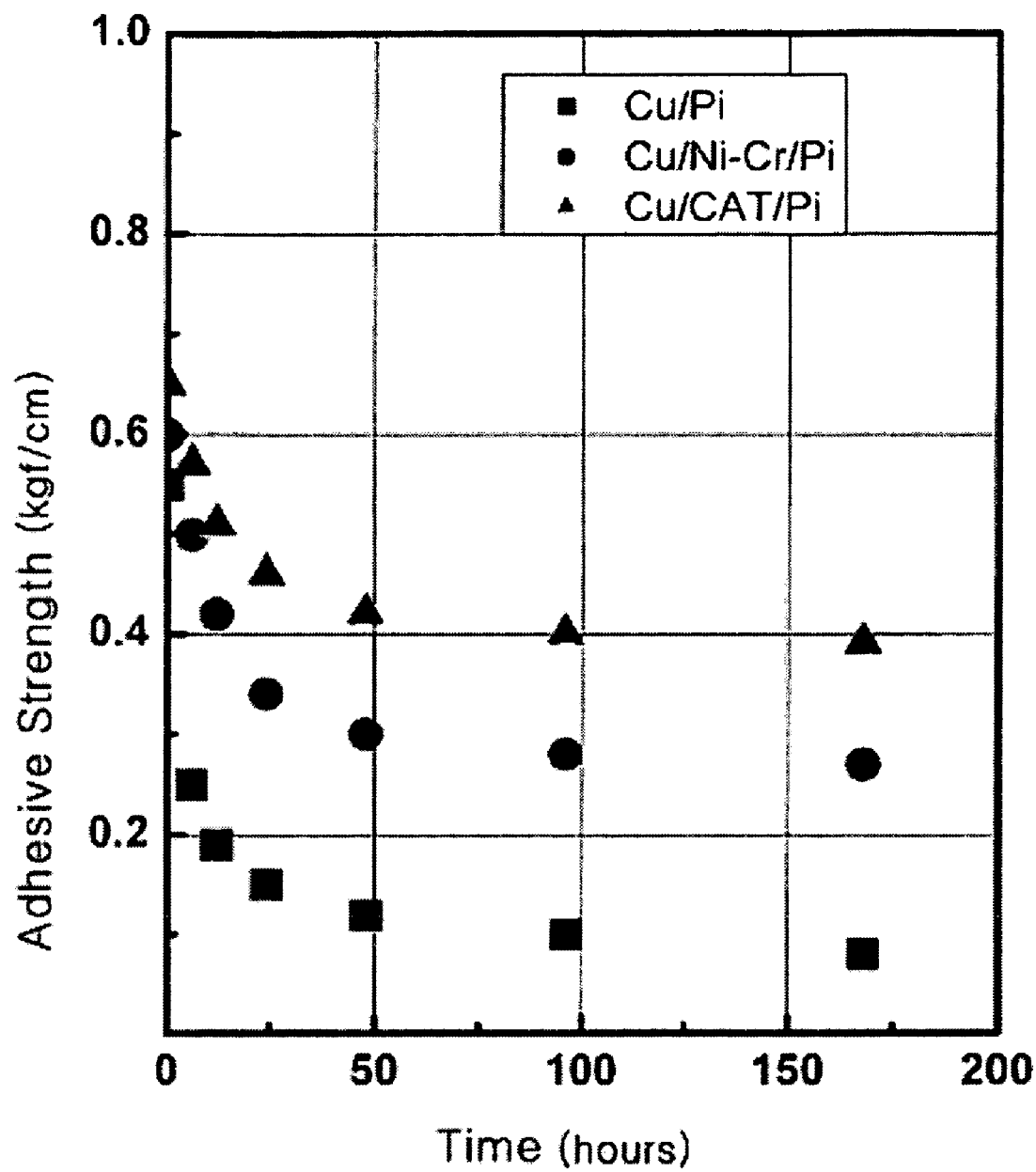

[Fig. 7]
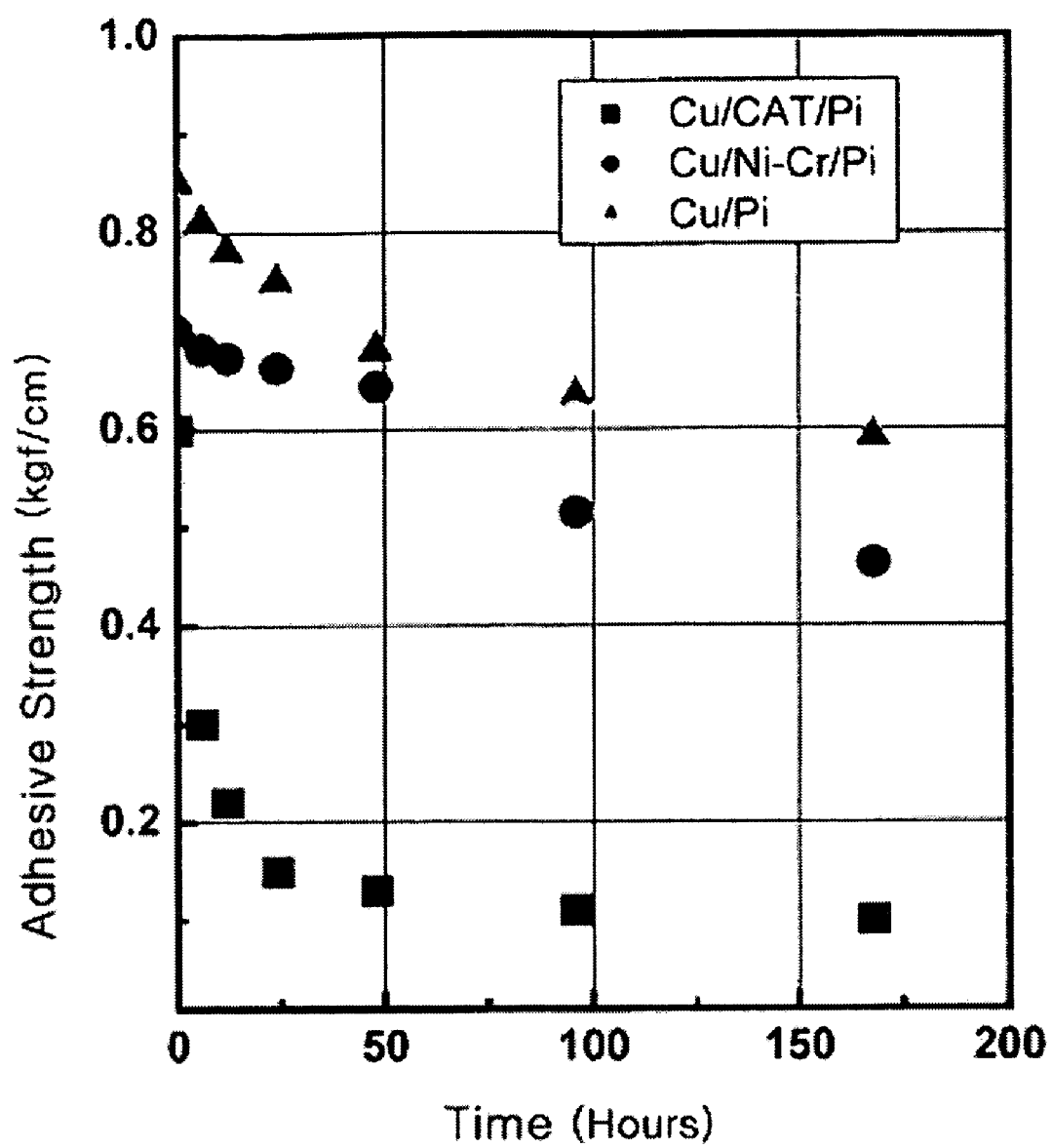

[Fig. 8a]
[Fig. 8b]
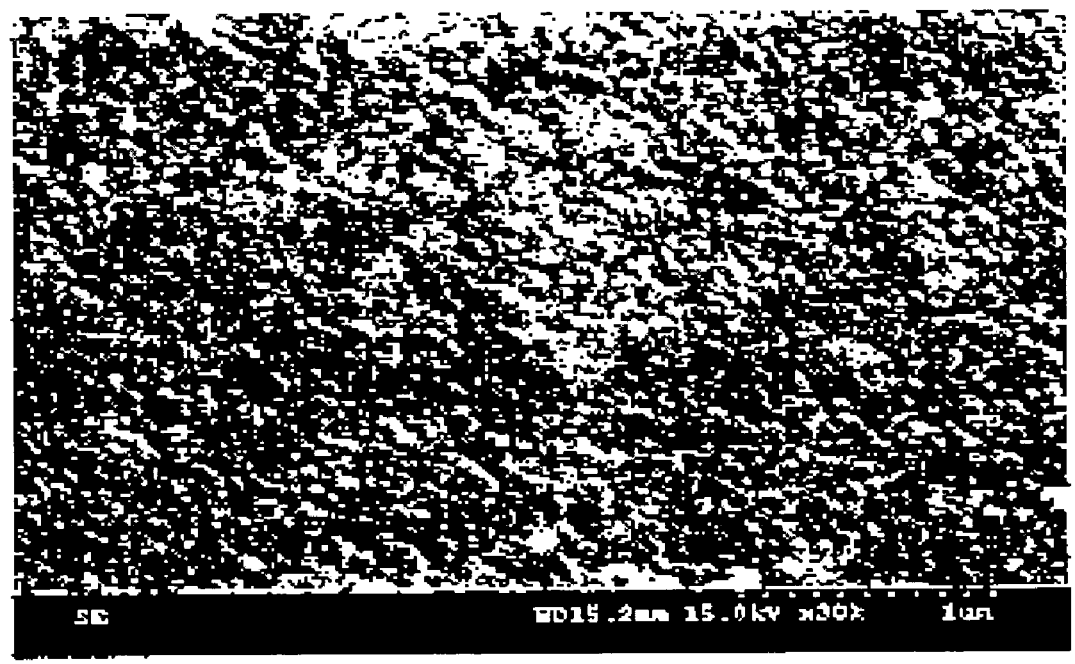

METHOD AND APPARATUS FOR LAMINATING A FLEXIBLE PRINTED CIRCUIT BOARD

BACKGROUND OF THE INVENTION

1. Field of the Invention

The present invention relates, generally, to a method of manufacturing a laminate including a base film and a metal foil for use in fabrication of a flexible printed circuit board (FPCB), and, more particularly, to a method of manufacturing a laminate for an FPCB, which comprises surface treating a base film to have excellent adhesive strength, heat resistance and dimensional stability.

2. Description of the Related Art

According to a recent tendency toward light weight, miniaturization, and high functionality of electronic products, PCBs have been increasingly used. Of the PCBs, in particular, an FPCB is advantageous because a circuit can be effectively formed even in a narrow space due to the use of a flexible and thin material, and the demand therefor is rapidly increasing.

In general, the FPCB includes a base film made of polyimide, polyester, or polyparavinyl acid, and a conductive metal foil made of copper, aluminum, iron, or nickel. As the base film, a polyimide film is mainly used thanks to its excellent thermal, electrical and mechanical properties.

Known as a conventional FPCB, a three-layered substrate includes a polyimide film and a copper foil bonded onto the polyimide film using an adhesive. Upon formation of a pattern, the three-layered substrate should undergo a heating process and a wet chemical treating process (etching, plating, developing, soldering, etc.). In this case, dimensional stability is decreased due to the difference in thermal expansion coefficient between the adhesive and the copper foil and between the adhesive and the polyimide film. In addition, the adhesive strength is decreased, attributed to the chemical treatment.

Electronic products, in particular, display devices, such as mobile phones and LCDs, are structured to be more complicated and denser. Simultaneously, the number of driver ICs functioning to drive devices and their degree of integration are further increasing. Thus, there is the need for a high density circuit pattern. However, since the three-layered substrate may cause the above problems due to the use of the adhesive, it is unsuitable for use in a high density circuit pattern.

To solve the above problems, thorough attempts have been made to manufacture a two-layered substrate for an FPCB having a metal layer formed by deposition, sputtering, ion plating, or copper plating, without the use of an adhesive.

Typically, the two-layered substrate for an FPCB may be manufactured by the following two techniques. That is, in the casting technique, polyimide liquid is applied on a metal layer, dried, cured and then processed into a film. In addition, the plating technique includes surface treating a polyimide film to realize high adhesive strength, coating the surface treated polyimide film with metal in a vacuum, and then conducting electrical plating using the above metal layer as a conductive layer, thereby forming a metal foil.

In the two-layered substrate without the use of the adhesive, the problem of low dimensional accuracy due to the difference in thermal expansion coefficient between the adhesive and the metal foil and between the adhesive and the polyimide film, as in the three-layered substrate, may be overcome. However, the adhesive strength between the metal foil and the polyimide film is remarkably weakened.

Hence, with the aim of improving the adhesion between the film and the metal to be deposited, a surface treated polyimide film may be used, or the surface of a polyimide film may be treated before deposition. In this way, the surface treatment of the polyimide film is carried out to wash the film as well as improve the adhesion between the polyimide film and the deposited metal.

The surface treatment process for the film includes mechanical treatment, such as blasting, hair line treatment and embossing, physicochemical treatment such as corona discharge and plasma treatment, or chemical solution treatment using a solvent, acid or alkali. Of these treatment processes, oxygen plasma treatment in a vacuum is frequently used in consideration of continuity to the subsequent procedures, productivity, contamination resistance, adhesion, and film degradation. The oxygen plasma treatment may be continuously performed while the film is transferred, followed by vacuum deposition, or may be independently performed.

Although the plasma treatment is conducted for two purposes, that is, washing and good adhesion, the adhesive strength and heat resistance are not increased as high as desired.

Further, the surface treatment of the base film by plasma is conducted at a rate of about 1 m/min. Therefore, an increase in the above treatment rate remains a task to be accomplished, to realize high productivity.

SUMMARY OF THE INVENTION

Accordingly, the present invention has been made keeping in mind the above problems occurring in the prior art, and an object of the present invention is to provide a method of manufacturing a laminate for an FPCB, which comprises surface treating a base film to have higher adhesive strength between the base film and a metal foil, heat resistance and dimensional stability.

Another object of the present invention is to provide a method of manufacturing a laminate for an FPCB, which can increase the treatment rate compared to a conventional surface treatment using plasma, to realize high productivity.

In order to accomplish the above objects, the present invention provides a method of manufacturing a laminate for an FPCB, comprising surface treating a base film by radiating ion beams using a gas mixture comprising oxygen and argon.

As such, the base film may be a polyimide film.

In addition, the gas mixture comprising oxygen and argon may include 50% or less oxygen, and preferably, 20-40% oxygen.

BRIEF DESCRIPTION OF THE DRAWINGS

The above and other objects, features and advantages of the present invention will be more clearly understood from the following detailed description taken in conjunction with the accompanying drawings, in which:

FIG. 1 is a sectional view showing a two-layered substrate for an FPCB, according to the present invention;

FIG. 2 is a graph showing the uniformity of ion beams represented by the ion beam current density along the longitudinal direction of a source upon surface treatment of a base film by ion beams using a gas mixture comprising oxygen and argon, according to the present invention, and upon conventional surface treatment of a base film by oxygen plasma;

FIG. 3 is a graph showing the wetting angle upon surface treatment of the base film by ion beams using a gas mixture comprising oxygen and argon, according to the present invention, and upon conventional surface treatment of the base film by oxygen plasma;

FIG. 4 is a graph showing the wetting angle depending on the ion dose upon radiation of ion beams onto the base film using various ions, according to the present invention;

FIG. 5 is a graph showing the initial adhesive strength depending on the oxygen content upon radiation of ion beams using a gas mixture comprising oxygen and argon, according to the present invention;

FIG. 6 is a graph showing the results for heat resistance test of the laminates in which the base film is conventionally surface treated by oxygen plasma;

FIG. 7 is a graph showing the results for heat resistance test of the laminates in which the base film is surface treated by ion beams using a gas mixture comprising oxygen and argon, according to the present invention; and FIG. 8a is an SEM photograph showing the base film sample which is conventionally surface treated by oxygen plasma, and FIG. 8b is an SEM photograph showing the base film sample which is surface treated by ion beams using a gas mixture comprising oxygen and argon, according to the present invention.

DESCRIPTION OF THE PREFERRED EMBODIMENTS

Hereinafter, a detailed description will be given of the present invention, with reference to the appended drawings.

FIG. 1 is a sectional view showing a two-layered substrate for an FPCB, according to the present invention.

As shown in FIG. 1, the two-layered substrate for an FPCB comprises a lower base film 2, a 5-20 nm thick tie layer 4 laminated on the base film 2, a metal conductive layer 6 laminated on the tie layer 4, and a metal plated layer 8 formed on the metal conductive layer 6 through plating of the metal conductive layer 6 using a photoresist composition.

The tie layer 4 functions to prevent the diffusion of a metal to be laminated and increase the adhesive strength, and is typically formed of Cr, Ni—Cr alloy, monel (Ni—Cu alloy), etc. In the present invention, a Cu—Ta—Zn alloy or a Cu—V—Zn alloy (hereinafter, referred to as 'CAT alloy') has first been used for the tie layer. When using a Cu—Ta—Zn alloy at a % ratio of 95:1:4 or a Cu—V—Zn alloy at a % ratio of 95:2:3, the best results are obtained.

The metal suitable for the metal conductive layer 6 and the metal plated layer 8 preferably includes, for example, aluminum, copper, gold, or silver. Typically, copper is used.

In the two-layered substrate for an FPCB, the base film 2 is made of a composition for use in formation of an organic film that may be prepared from a typical polymerizable film, including an addition polymer, a condensed polymer, a natural polymer, a treated film, or a thermosetting or thermoplastic resin. In particular, a polyimide film may be preferably used as the base film.

To manufacture a laminate having predetermined adhesive strength and heat resistance, it is preferable that a surface treated base film be used or the surface of a base film be treated before deposition. In the present invention, for the surface treatment of the base film, a surface treating process using ion beams is adopted.

In manufacturing a thin film, ion beam treatment techniques include, for example, ion implantation or ion beam radiation using high energy (from tens of KeV to ones of MeV), or ion beam sputtering deposition for radiating an ion source able to form particles of low energy (from 0 to ones of KeV) onto a target to deposit a material. In the present invention an ion beam sputtering technique is adopted.

According to the ion beam sputtering technique, when ion beams are radiated onto the base film, gases emitted from an ion gun are accelerated, and simultaneously, voltage is applied to the base film to be surface treated. Thereby, due to attractive force or repulsive force between ions generated from the ion gun and the surface of the film sample, electrical charges are converted, thus modifying the composition and morphology of the surface of the film sample.

In the present invention, the gas emitted from the ion gun includes, for example, Ar, $O_2$, or Ar+$O_2$.

FIG. 2 is a graph showing the uniformity of ion beams represented by the ion beam current density along the longitudinal direction of the source upon surface treating the film using ion beams, according to the present invention, and upon conventional surface treating a film using oxygen plasma.

In the conventional surface treatment of the film by plasma, a 1,024 mm wide polyimide film and oxygen are used as the base film and the reactive gas, respectively.

Meanwhile, in the film treatment using ion beams of the present invention, a 1,024 mm wide polyimide film is used as the base film, and a gas mixture comprising oxygen and argon is used as an ion beam emitting gas, in which the oxygen content is 30%.

As shown in FIG. 2, when the film is surface treated by ion beams using a gas mixture comprising oxygen and argon, according to the present invention, highly uniform current density may be obtained in the range from −30 to 30 cm, unlike conventional surface treatment of the film by oxygen plasma. In the present invention, the reason why the current density is drastically increased in the area outside of the above range from −30 to 30 cm is that the gas mixture comprising oxygen and argon, serving as the ion beam emitting gas, is overlappingly radiated in the above area. Therefore, if the gas mixture is applied onto the base film within the above range, the base film may have excellent roughness due to uniformly high current density.

FIG. 3 is a graph showing the wetting angle upon surface treatment of the film by ion beams using a gas mixture comprising oxygen and argon, according to the present invention, and upon conventional film surface treatment by oxygen plasma.

A typical wetting angle measuring instrument is used to measure the wetting angle according to a liquid droplet method. Upon conventional film surface treatment using oxygen plasma, a wetting angle is in a high range from about 20 to 40° and severely varies. However, the film surface treatment using ion beams, according to the present invention, results in a low and uniform wetting angel less than about 10° in the range from −30 to 30 cm.

In this way, when the wetting angle of the surface treated film is low and uniform, the film has many contacting points with a metal to be deposited, thus increasing the adhesive strength.

FIG. 4 is a graph showing the variation in wetting angle depending on the ion dose per gas component of ion beams upon radiation of ion beams onto the base film, according to the present invention.

When ion beams are radiated, the gas component includes, for example, argon gas, nitrogen gas, or a gas mixture comprising oxygen and argon. As such, the gas mixture comprising oxygen and argon includes 30% oxygen.

In addition, to use the gas mixture comprising oxygen and argon as a gas component of ion beams may exhibit an excellent wetting angle of 10° or less, which is drastically lower than when using the argon gas or nitrogen gas. The ion beams are radiated in a dose of $10^{15}$-$10^{18}$ ions/cm$^2$.

FIG. 5 is a graph showing the initial adhesive strength depending on the oxygen content upon the radiation of ion beams using a gas mixture comprising oxygen and argon onto the base film, according to the present invention.

From the graph shown in FIG. 5, it can be seen that the Cu/Ni—Cr/PI laminate or Cu/CAT/PI laminate has high adhesive strength when the oxygen content is 50% or less. In particular, when the oxygen content is 30%, all of three laminates have the highest adhesive strength.

Initial adhesive strength between the copper foil and the base film when surface treating the base film using ion beams and when conventionally surface treating the base film using oxygen plasma is measured. The results are given in Table 1, below.

TABLE 1

| Gas | Cu/PI | Cu/Ni—Cr/PI | Cu/CAT/PI |
|---|---|---|---|
| No Surface Treatment | 0.15 | 0.2 | 0.55 |
| Argon | 0.35 | 0.55 | 0.65 |
| Oxygen Plasma | 0.55 | 0.6 | 0.65 |
| Gas Mixture of Oxygen and Argon | 0.6 | 0.7 | 0.85 |

(unit: kgf/cm)

As is apparent from Table 1, in all of the Cu/PI, Cu/Ni—Cr/PI, and Cu/CAT/PI laminates, the adhesive strength is the highest when ion beams are radiated using the gas mixture comprising oxygen and argon. Particularly, in the Cu/CAT/PI laminate, the adhesive strength upon radiation of ion beams using the gas mixture comprising oxygen and argon is much higher than that upon radiation of ion beams using argon gas or upon surface treatment by oxygen plasma.

FIG. 6 is a graph showing the heat resistance test results of the laminates which are conventionally film surface treated by oxygen plasma.

In the plasma treatment, oxygen is used as a reactive gas, and Cu/CAT/PI, Cu/Ni—Cr/PI and Cu/PI laminates are used as an object structure. For the heat resistance test, each laminate is loaded into an oven at 150° C., and adhesive strength is measured over time.

As shown in FIG. 6, in the Cu/CAT/PI laminate having initial adhesive strength of 0.65 kgf/cm, the adhesive strength is maintained at about 0.39 kgf/cm, even after heat resistance testing for 168 hr (7 days). However, in the Cu/Ni—Cr/PI laminate having initial adhesive strength of 0.60 kgf/cm, the adhesive strength is decreased to about 0.33 kgf/cm after heat resistance testing for 168 hr (7 days).

FIG. 7 is a graph showing the heat resistance test results of the laminates which are film surface treated by ion beams using a gas mixture comprising oxygen and argon, according to the present invention.

As such, the gas mixture comprising oxygen and argon serves as a gas component of ion beams, and Cu/CAT/PI, Cu/Ni—Cr/PI and Cu/PI laminates are used as an object structure. For the heat resistance test, each laminate is loaded into an oven at 150° C., and adhesive strength is measured over time.

As shown in FIG. 7, the Cu/CAT/PI laminate has initial adhesive strength of 0.85 kgf/cm, and adhesive strength of about 0.6 kgf/cm after heat resistance testing for 168 hr (7 days), which is higher than upon conventional oxygen plasma treatment. In addition, the Cu/Ni—Cr/PI laminate has initial adhesive strength of 0.65 kgf/cm, and adhesive strength of about 0.47 kgf/cm after heat resistance testing for 168 hr (7 days), which is higher than upon conventional oxygen plasma treatment.

Consequently, the laminate having undergone film surface treatment with ion beams, according to the present invention, is confirmed to have much higher heat resistance than the laminate having undergone conventional film surface treatment with oxygen plasma.

FIG. 8a is an SEM photograph showing the film sample which is conventionally surface treated using oxygen plasma, and FIG. 8b is an SEM photograph showing the film sample which is surface treated by ion beams using a gas mixture comprising oxygen and argon, according to the present invention.

As shown in FIGS. 8a and 8b, higher and more uniform roughness is obtained upon surface treatment by ion beams using a gas mixture comprising oxygen and argon than upon surface treatment by oxygen plasma.

Moreover, the base film is surface treated at a rate of about 2.5-3 m/min by radiating ion beams using a gas mixture comprising oxygen and argon, whereas the film is surface treated at a rate of about 1 m/min using oxygen plasma. Hence, an increase in the surface treatment rate may result in high productivity.

The method of manufacturing the laminate for an FPCB of the present invention may be applied to all fields of electronic products, for example, FPCBs, and circuit substrates, such as TAB, COF and BGA.

As described above, the present invention provides a method of manufacturing a laminate for an FPCB. According to the method of the present invention, when the FPCB is manufactured, the base film is surface treated by radiating ion beams using a gas mixture comprising oxygen and argon. Thereby, the laminate for an FPCB having high heat resistance and high adhesive strength between the film and the metal can be manufactured.

In addition, according to the method of the present invention, the surface treatment of the base film by radiation of ion beams using a gas mixture comprising oxygen and argon can be conducted at a rate 2-3 times higher than conventional treatment using plasma, thus increasing productivity.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for laminating a flexible printed circuit board, the method comprising:
   preparing a base film, wherein the surface of the base film is treated by radiating ion beams using a gas mixture of oxygen and argon and the surface is treated by forming a tie layer on the surface treated base film, wherein the tie layer is formed of copper based alloy including Cu—Ta—Zn alloy or Cu—V—Zn alloy; and
   forming a metal conductive layer laminated on the tie layer.

2. The method according to claim 1, wherein the base film is a polyimide film made of an organic film including an addition polymer, a condensed polymer, a natural polymer, a treated film, a thermosetting or a thermoplastic resin.

3. The method according to claim 1 or 2, wherein the gas ratio of the oxygen of the gas mixture is about 50% or less.

4. The method according to claim 3, wherein the ratio of the oxygen of the gas mixture is about 20-40%.

5. The method according to claim 1, wherein the ratio of the Cu—Ta—Zn is about 95%: 1%: 4% and the ratio of the Cu—V—Zn is about 95%: 2%: 3%.

6. The method according to claim 1, wherein a thickness of the tie layer is about 5-20 nm and width of the polyimide film is about 1,024 nm.

7. The method according to claim 1, wherein the metal conductive layer further includes a metal plate layer on the metal conductive layer.

8. The method according to claim 1, wherein the surface of the base film is treated at a rate of about 2.5-3 m/min.

* * * * *